United States Patent [19]

Carey

[11] Patent Number: 5,240,671
[45] Date of Patent: Aug. 31, 1993

[54] METHOD OF FORMING RECESSED PATTERNS IN INSULATING SUBSTRATES

[75] Inventor: David H. Carey, Austin, Tex.

[73] Assignee: Microelectronics And Computer Technology Corporation, Austin, Tex.

[21] Appl. No.: 891,029

[22] Filed: Jun. 1, 1992

[51] Int. Cl.$^5$ .............................. B22F 7/04; H01K 3/22
[52] U.S. Cl. ............................................ 419/9; 29/851; 264/241; 264/264; 264/58
[58] Field of Search .................. 156/635, 89, 656; 29/851, 848; 174/68.5; 419/9, 7; 264/58, 264, 241

[56] References Cited

U.S. PATENT DOCUMENTS

| | | | |
|---|---|---|---|
| 3,991,029 | 11/1976 | Adelman | 524/555 |
| 4,345,955 | 8/1982 | Bakermans et al. | 156/89 |
| 4,540,621 | 9/1985 | Eggerding et al. | 428/209 |
| 4,546,065 | 10/1985 | Amendola et al. | 430/313 |
| 4,581,098 | 4/1986 | Gregor | 156/635 |
| 4,715,117 | 12/1987 | Enomoto | 29/851 |
| 4,766,671 | 8/1988 | Utsumi et al. | 29/848 |
| 4,792,646 | 12/1988 | Enomoto | 174/68.5 |
| 4,825,539 | 5/1989 | Nagashima et al. | 29/848 |
| 4,929,575 | 5/1990 | Khoury et al. | 501/137 |
| 5,009,744 | 4/1991 | Mandai et al. | 156/656 I |

Primary Examiner—Donald P. Walsh
Assistant Examiner—Anthony R. Chi
Attorney, Agent, or Firm—David M. Sigmond; Anthony V. S. England

[57] ABSTRACT

A method of forming recessed patterns in insulators is described. One embodiment of the invention is directed to ceramic green sheet fabrication by providing a sculptured plastic tape mold which includes a floor, a plurality of sidewalls adjacent to and extending above the floor and a plurality of protrusions on and extending above the floor, casting a ceramic slurry into the mold such that the slurry contacts the floor, the sidewalls and the protrusions, and drying the slurry so as to produce a ceramic green sheet with a recessed pattern that replicates the shapes of the protrusions. The ceramic green sheet may be removed from the mold and filled with a conductor before firing; alternatively, the ceramic green sheet can be fired before removing the mold to form a rigid ceramic substrate which is then filled with a conductor.

55 Claims, 6 Drawing Sheets

METHOD OF FORMING RECESSED PATTERNS IN INSULATING SUBSTRATES

BACKGROUND OF THE INVENTION

1. Field of the Invention

The present invention relates to the manufacture of electronic components, and more particularly to forming recessed patterns such as trenches and vias in insulating substrates such as polymers and ceramic green sheets by depositing a castable insulator into a mold.

2. Description of Related Art

Smaller and faster electronic devices offer obvious advantages. Fast electronic devices usually require short connections between the attendant integrated circuit chips. This in turn demands that the chips be located close together. Close chip spacing also provides for smaller devices. To locate chips close together they are commonly mounted on the top layer of a flat, insulating substrate and interconnected by conductors routed in several underlying layers of the substrate. This arrangement is called a multi-chip module ("MCM").

In producing a typical MCM, conductors are applied to a single 4 or 5 mm thick layer of ceramic substrate and each layer of the substrate-conductor combination is then stacked with dozens of other layers. In some methods the conductors are routed on the surface of each layer, while in others the conductors are embedded or recessed into each layer. Ceramic is well suited for substrates because it has low thermal expansion, high thermal conductivity, mechanical strength, excellent electrical insulation, and reasonable cost. However, it may be difficult to form the recessed patterns needed for embedded conductors in ceramic because ceramic is dense even before it is fired. After it is fired ceramic is very hard and brittle and thus difficult to pattern.

A ceramic substrate is typically produced by first forming an unpatterned mold or "carrier tape" such as by extruding a thermal plastic film. A suspension of aluminum particles in a polymer binding is then cast onto the carrier tape. This suspension is then cured to a patternless unfired sheet ("ceramic green sheet") to be used as one substrate layer in a multilayer MCM. After conductors are applied to each layer, the layers are stacked together and fired into a rigid unit.

Several methods are known for forming patterns of conductors in layers of ceramic substrates without first forming recesses therein. Typically these methods extrude the conductors onto the substrate through a metal mask by screen printing. But screen printing cannot produce conductors with dimensions that are high relative to width, that is, it cannot widely vary the conductor aspect ratio by varying conductor height. Nor can screen printing produce conductors of precise dimensions. Furthermore, screen printing does not allow the layers of substrate and conductors to be tightly stacked before firing because they are not entirely flat.

Several methods are also known for improving flatness where the conductors are formed on the substrate surface. One such method, disclosed in U.S. Pat. No. 4,109,377 issued to Blazick et al., places the conductors on the surface of each layer of the substrate and presses the layers together, thereby somewhat flattening the conductors. Also, the conductors cannot be closely spaced because pressing the layers together causes the conductors to spread out. This conductor spreading also limits the signal propagation speed as described in U.S. Pat. No. 4,581,098 issued to Gregor. Another method, disclosed in U.S. Pat. No. 4,825,539 issued to Nagashima et al., presses conductors into the top of each layer while cooling the conductors and heating the substrate. This does result in a flat surface. It also reduces, although does not entirely eliminate, spreading of the conductors. Besides not altogether eliminating conductor spreading, a further disadvantage is the heating and cooling required. Another method, disclosed in U.S. Pat. No. 5,009,744 issued to Mandai et al., reduces the thickness of the metal layer on the surface of the substrate by forming it first on a "back film" and then transferring it to the substrate. This method does not, however, produce an entirely flat surface.

Another method forms a partial pattern of recesses in the surface of the substrates. U.S. Pat. No. 4,715,117 issued to Enomoto describes forming a substrate with a regular pattern of through-holes, typically by mechanical or laser drilling or by punching; then the unwanted holes are filled; finally the selected holes are metal plated at the same time that the surface of the substrate is plated. This method does not produce a flat surface because it does not provide a complete pattern of recesses. That is, it provides through-holes or "vias" for conductors that run between the flat surfaces of the substrate layer, but it does not provide "trenches" that are needed for the conductors that run parallel to the top major surfaces of the substrate. Besides that disadvantage, this method does not fill the entire through-hole with conductor material.

Other methods do provide a complete pattern of recesses. Recesses have commonly been formed by pressing a mold into a flat ceramic green sheet substrate. However, as the Gregor '098 Patent referred to above points out, the green sheet is too hard and dense for this "branding" technique to work well. For example, the features of the mold or punch must be relatively large in order to be sturdy enough to press a pattern into the green sheet. Consequently, other techniques have been developed to "thermally machine" the ceramic green sheet, such as by exposing the ceramic green sheet to laser or electron beam radiation through a mask. These thermal machining methods are effective but require expensive and delicate machinery applied under carefully controlled conditions. Another method, disclosed in the Gregor '098 Patent, forms a pattern of xeroxed, stenciled, or photolithographed lines on the substrate surface and then exposes the lined surface to a source that selectively heats the lines until the substrate underneath vaporizes. Gregor's method, however, has limited reproduceability due to inconsistent thermal decomposition.

In summary, prior methods of applying conductors to a substrate where the resulting substrate-conductor surface is not flat are relatively simple, but frequently do not allow stable, compact multilayered structures, precise conductor dimensions, or wide variation in conductor aspect ratios. The simplest methods to make the layers more stable and compact cause conductor spread, which limits the size, spacing, and resistivity of the conductors. These spacing and resistivity limitations prevent smaller packages and faster devices. By forming recessed patterns in the ceramic substrate the layers can be stacked tightly without spreading the conductors, but this requires additional steps, and sometimes requires expensive, delicate equipment operated under carefully controlled conditions. And some simple methods of producing recessed patterns are not capable of producing very small features.

SUMMARY OF THE INVENTION

A principle object of the present invention is to provide a simple method of forming recesses for conductors in a substrate. Another object of the invention is to form complex recessed patterns in a substrate while at the same time casting the substrate into a planar shape. A further object is to embed tightly spaced conductors with large aspect ratios in small recessed patterns while maintaining a flat surface on the top of a thin substrate so that multiple layers of such substrate-conductor structures may be compactly stacked together.

A feature of the present invention is providing a mold which includes a floor, a plurality of sidewalls adjacent to and extending above the floor and a plurality of protrusions on and extending above the floor, pouring a ceramic slurry into the mold such that the slurry contacts the floor, the sidewalls and the protrusions, and drying the slurry so as to produce a ceramic green sheet with a recessed pattern that replicates the shapes of the protrusions.

An advantage of the present invention is that few manufacturing steps are required to produce a planar substrate with a featured surface. Another advantage is that the size of the patterned features can be precise, narrow, deep, and closely spaced while the substrate can remain thin. Another advantage is that a single metallization step can be used to form recessed conductors that are parallel to the planar surface and that traverse the surfaces in vias. Also, the conductor aspect ratio can be widely varied.

These and other objects, elements and advantages of the present invention will be further described and more readily apparent from a review of the detailed description and preferred embodiments which follow.

BRIEF DESCRIPTION OF THE DRAWINGS

The following detailed description of the preferred embodiments can best be understood when read in conjunction with the following drawings.

DETAILED DESCRIPTION OF THE PREFERRED EMBODIMENTS

Referring now to the drawings, FIGS. 1 through 8 illustrate views of successive manufacturing stages in accordance with one embodiment of the invention directed to forming vias and trenches in a substrate and filling the vias and trenches with a conductor.

Figure 1:
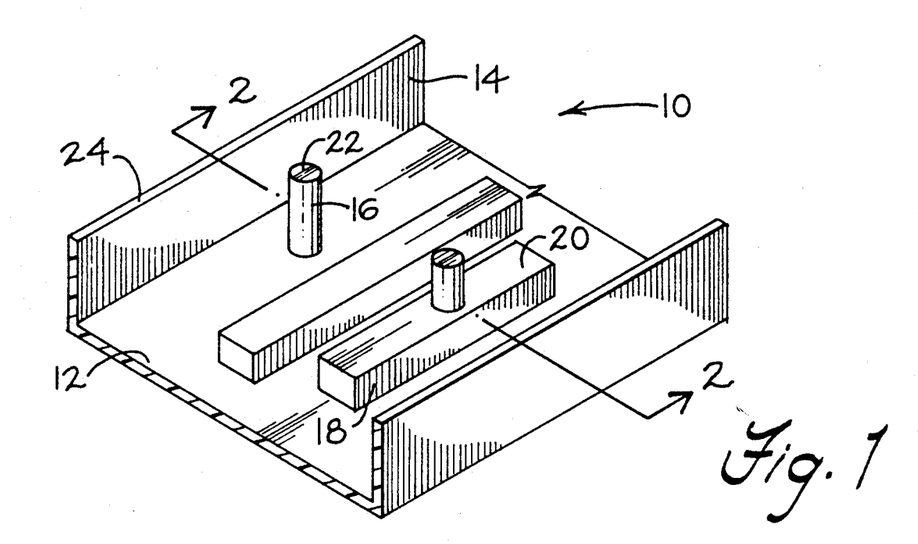
FIG. 1 is an isometric view of an empty mold with protrusions for receiving a ceramic slurry.

Referring now to FIG. 1, a mold with at least one protrusion is provided. As may be seen, a sculptured plastic tape mold 10 includes a planar floor 12, and planar sidewalls 14 adjacent to and extending perpendicularly above opposite sides of floor 12. Vertically disposed cylindrical protrusions 16 and horizontally disposed rectangular protrusions 18 are mounted on and extend above floor 12. Cylindrical protrusions 16 may be integral with or separate from rectangular protrusions 18. Rectangular protrusions 18 have flat top surfaces 20 positioned in parallel with floor 12. Top surfaces 22 of cylindrical protrusions 16 and top surfaces 24 of side walls 14 are located above surfaces 20.

Figure 2:
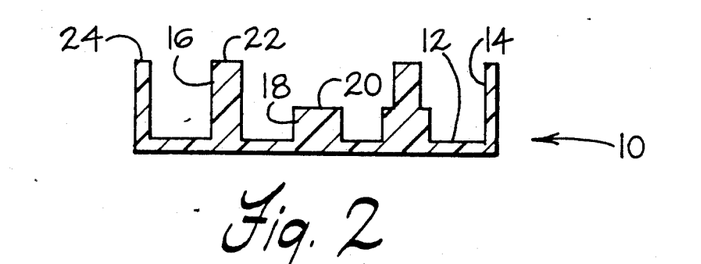
FIG. 2 is a cross-sectional view of the empty mold taken across line 2—2 in FIG. 1.

With reference now to FIG. 2, a section of mold 10 taken across line 2—2 of FIG. 1 is illustrated to show floor 12 together with sidewalls 14, protrusions 16 and 18, top surfaces 24 of walls 14, top surfaces 20 of protrusions 18, and top surfaces 22 of protrusions 16.

Figure 3:
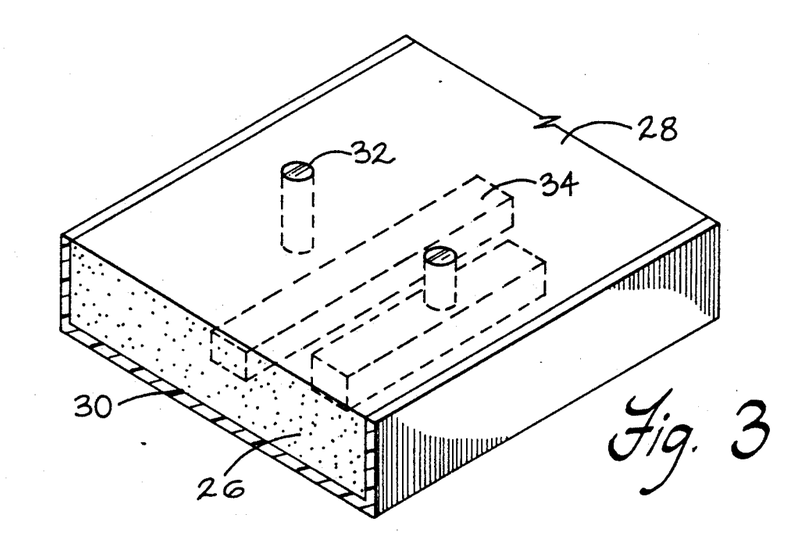
FIG. 3 is an isometric view of the mold filled with a ceramic slurry.

Referring now to FIG. 3, a castable insulator is deposited into the mold such as by doctor blading. Suitable insulators include ceramics, slurries and polymers generally. Polyimides and epoxies are preferred polymers. Beryllia, mullite, barium titanate, and silicon carbide are suitable ceramic substrates where a green sheet is not desired. A suitable ceramic slurry for producing green sheets includes, for example, aluminum oxide and glass particles suspended in a polymer binding agent together with a plasticizer. As an alternative, alumina and aluminum nitride ceramic slurries are well suited to the green sheet process. For illustration purposes, a castable insulator of ceramic slurry 26 shall be depicted herein. Upon being deposited into mold 10, ceramic slurry 26 has a top surface 28 and bottom surface 30 on mold floor 12. Slurry 26 conforms to the shape of the mold 10. That is, slurry 26 is contained by sidewalls 14 and covers floor 12 and rectangular protrusions 18 while surrounding and partially covering cylindrical protrusions 16. Vibration or some other method of compacting may be required in order to assure that the deposited slurry forms a uniform, voidless layer in mold 10. As a result, cylindrical protrusions 16 and rectangular protrusions 18 displace ceramic slurry 26 to respectively form the desired vertically disposed cylindrical voids or cavities, referred to herein as vias 32, and the desired horizontally disposed rectangular voids or cavities, referred to herein as trenches 34.

It should be noted that the use of sidewalls 14 is not mandatory. That is, sidewalls 14 could be eliminated and the surface tension of slurry 26 could be relied upon to contain the unobstructed edges of the slurry. Such unobstructed slurry edges may be formed as fairly straight lines by holding the width of the slurry constant during deposition, or by a slitting operation after the slurry is deposited.

Figure 4:
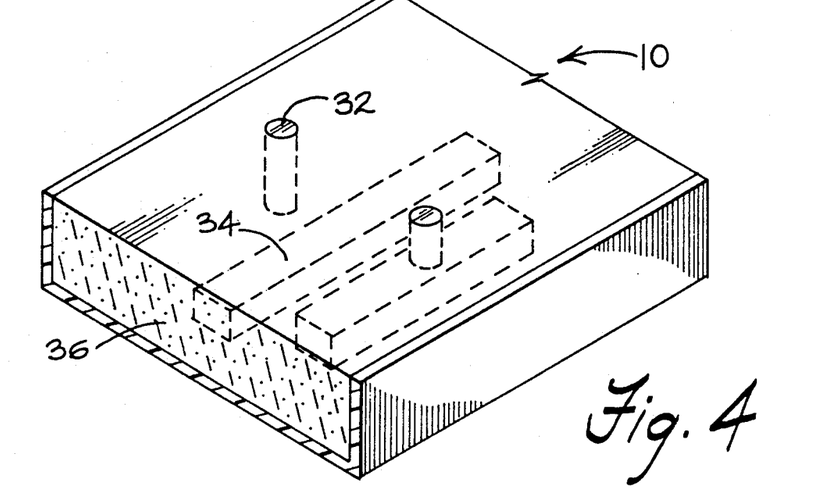
FIG. 4 is an isometric view of a patterned ceramic green sheet in the mold after partially curing the slurry.

With reference now to FIG. 4, the ceramic slurry is solidified into a flexible ceramic green sheet 36 by heating, drying and aging to polymerize the binding agent and to remove volatile organic compounds. Techniques for curing ceramic slurries into ceramic green sheets are well known in the art.

Figure 5:
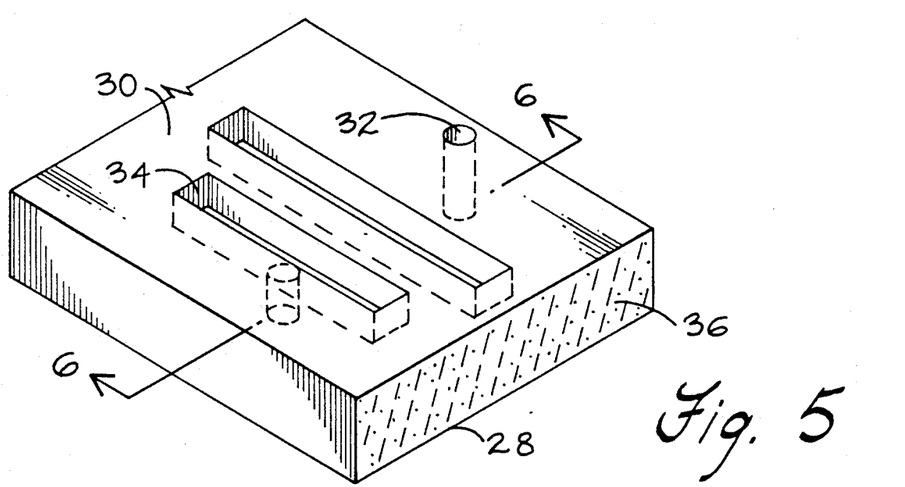
FIG. 5 is an isometric view of the ceramic green sheet removed from the mold and inverted to illustrate the trenches and vias therein which replicate the mold protrusions.

Referring to FIG. 5, ceramic green sheet 36 is removed from mold 10 (not shown) and inverted so that surface 30 that was on the floor 12 of mold 10 is now the exposed top surface. Surface 30 is essentially flat and both the top major surface and the patterned surface (with recesses therein) of green sheet 36. Likewise, the surface 28 that was the top slurry surface in mold 10 is now the bottom surface of the inverted green sheet. This inverted position advantageously places vias 32 and trenches 34 in view. Vias 32 and trenches 34 are seen to precisely replicate protrusions 16 and 18, respectively, of mold 10. Thus, the removal of green sheet 36 from mold 10 does not disturb the shapes of vias 32 or trenches 34. Clearly, it is desirable to have low adhesion between the mold and the substrate, as is the case with plastic mold 10 and ceramic green sheet 36.

Figure 6:
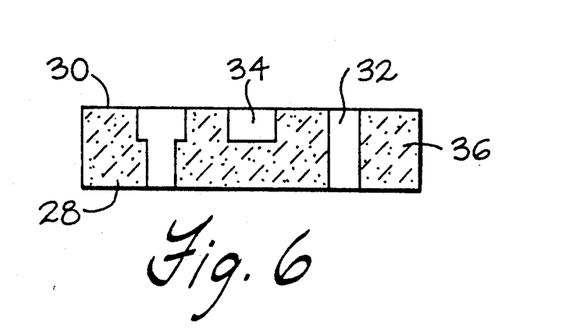
FIG. 6 is a cross-sectional view of the patterned ceramic green sheet removed from the mold taken across line 6—6 in FIG. 5.

With reference to FIG. 6, a section taken across line 6—6 of FIG. 5 is illustrated showing the ceramic green sheet 36, major surfaces 28 and 30, vias 32 and trenches 34.

Figure 7:
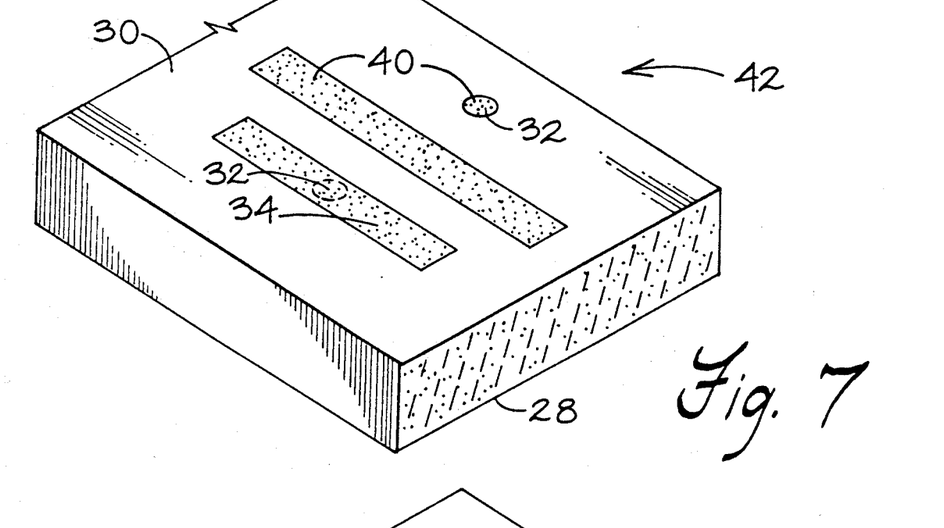
FIG. 7 is an isometric view of the ceramic green sheet with the trenches and vias filled with an electrically conductive metal paste.

Referring to FIG. 7, ceramic green sheet 36 is inverted, and vias 32 and trenches 34 are filled with a metal 40 to produce a planar substrate-metal structure 42. Suitable electrically conductive metal pastes for metal 40 include molybdenum, tungsten, gold and copper. Filling is accomplished such as by extruding, rolling, wiping, doctor blading, etc. Liquid or powder conductive material could also be used. Alternatively, the trenches or vias could be filled with an optical conductor or left empty.

Figure 8:
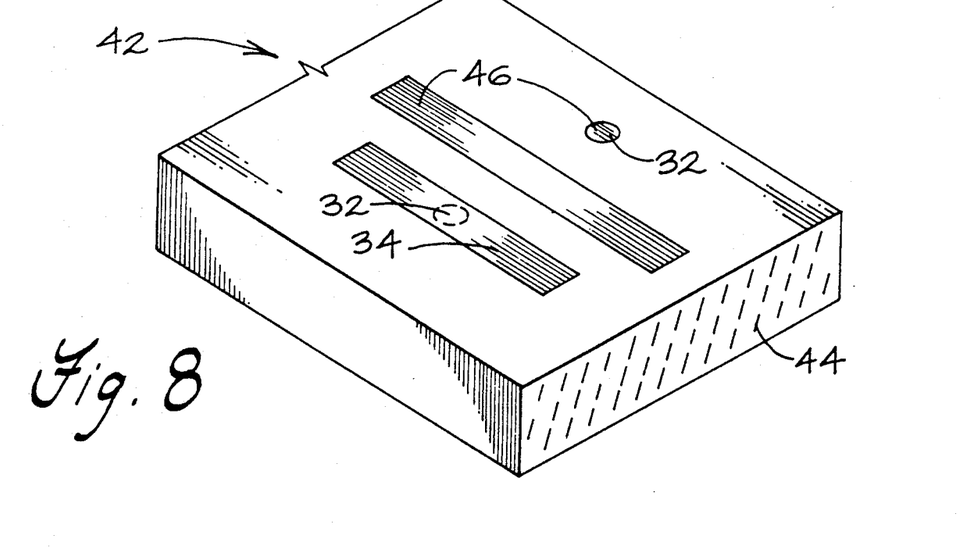
FIG. 8 is an isometric view of a hardened ceramic and conductors after firing the green sheet.

With reference now to FIG. 8, the planar structure 42 is fired into a hardened ceramic 44 containing a hardened metal 46, such as by placing structure 42 in a kiln with a reducing atmosphere at a temperature of 1250° C. to 1500° C. Methods for firing a ceramic green sheet into a hardened ceramic structure are well known in the art. Metal 46 forms a fully inlaid, firmly bonded metallurgical pattern embedded in vias 32 and trenches 34 which replicates the shapes of protrusions 16 and 18.

Figure 9:
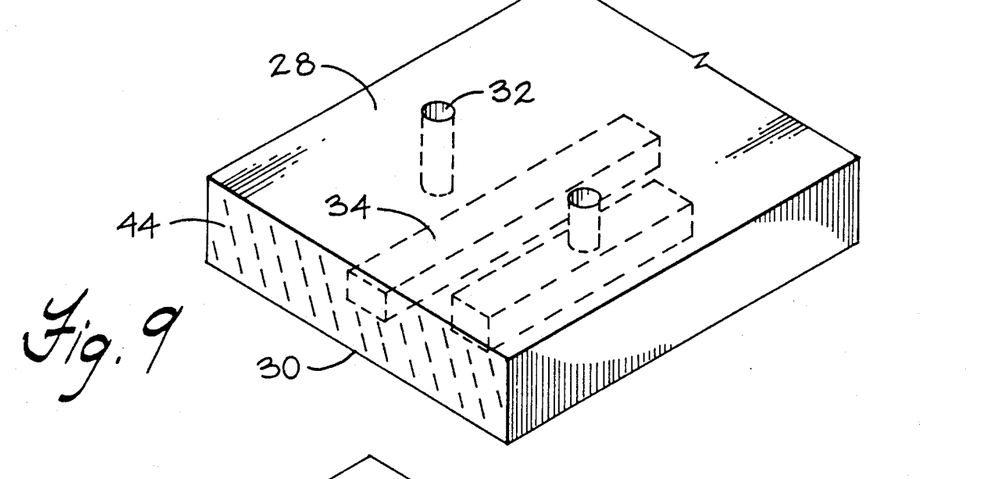
FIG. 9 is an isometric view of another embodiment in which the mold is removed by firing so that a hardened ceramic with empty vias and trenches is produced.
Figure 10:
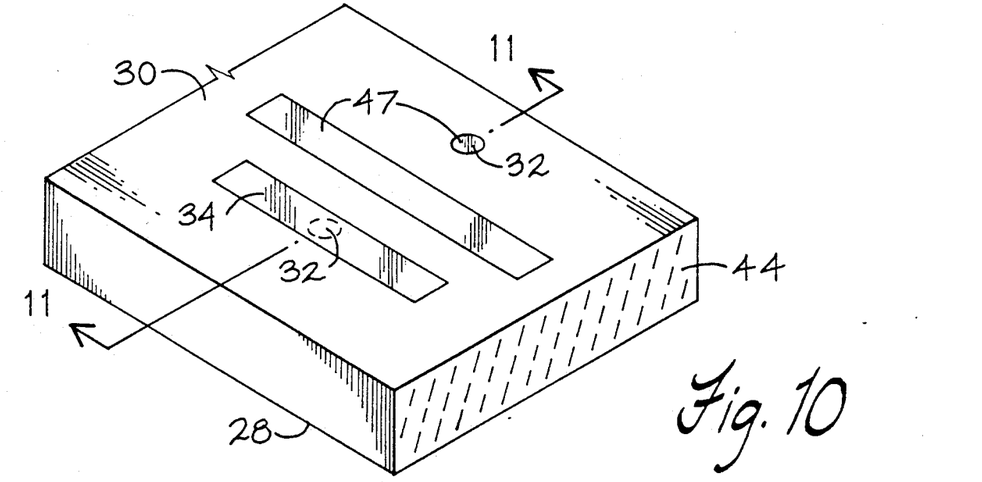
FIG. 10 is an isometric view of the hardened ceramic of FIG. 9 inverted with the trenches and vias filled with an electrical conductor.

FIGS. 9 and 10 illustrate another embodiment for embedding metal conductors into a hardened ceramic in accordance with the present invention. In this embodiment, the steps of providing mold 10 in FIG. 1 and depositing slurry 26 into mold 10 in FIG. 3 are repeated as previously described. However, instead of curing the slurry into a ceramic green sheet and removing the green sheet from the mold before firing the green sheet, the green sheet is left in the mold and fired as previously described in FIG. 8 so that a hardened ceramic is removed from the mold. Thereafter, a conductor can be filled into the vias and trenches in the hardened ceramic.

Referring now to FIG. 9, mold 10 is provided, ceramic slurry 26 is deposited into mold 10, and ceramic green sheet 36 is formed as previously described. In this embodiment, however, ceramic green sheet 36 is not removed from mold 10 prior to the firing operation. Instead, ceramic green sheet 36 is left in mold 10 and then fired. Thereafter, as is shown, a hardened ceramic 44 is produced and removed from the mold. In addition, if desired, the mold may be removed from hardened ceramic 44 as part of the firing operation by using a mold with a low melting or vaporization temperature. For example, the ceramic green sheet 36 and the plastic mold 10 as shown in FIG. 4 may be placed into a kiln at a high temperature (1250° C. to 1500° C.) so that the mold is incinerated while the ceramic is hardened.

With reference now to FIG. 10, the hardened ceramic 44 is inverted so that the surface 30 that was on the floor 12 of mold 10 (not shown) is now the exposed top surface. Likewise, the surface 28 that was the top surface prior to inverting the ceramic is now the bottom surface. Vias 32 and trenches 34 in hardened ceramic 44 are filled with conductor 47. In this embodiment the conductor does not have to undergo firing with the ceramic so it may be different than the metal paste illustrated in FIG. 7. Electroless deposition, for example, could be used to plate metal into the vias and trenches. Furthermore, vias 32 and trenches 34 can be filled with an optical conductor or left empty.

Figure 11:
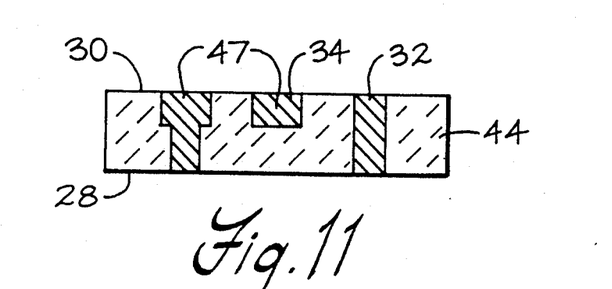
FIG. 11 is a cross-sectional view of the hardened ceramic and conductors therein taken across line 11—11 in FIG. 10.

Referring now to FIG. 11, a section across line 11—11 of FIG. 10 is illustrated showing the hardened ceramic 44, the major surfaces 28 and 30, and conductor 47 as a fully inlaid, firmly bonded metallurgical pattern embedded in vias 32 and trenches 34 which replicates the protrusions of mold 10.

Figures 12, 13:
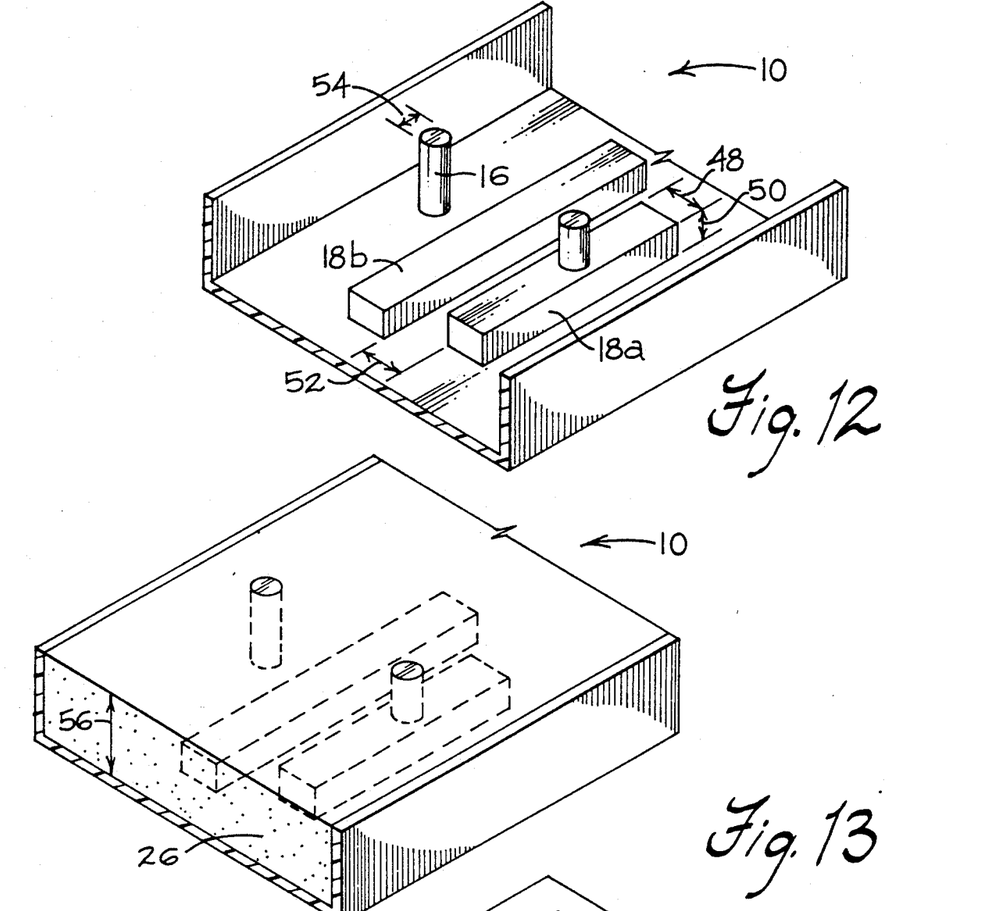
FIG. 12 is an isometric view of the mold of FIG. 1 where the protrusions have certain precise dimensional limitations.
FIG. 13 is an isometric view of the mold of FIG. 12 with a ceramic slurry filled to a specified depth so that the resulting green sheet is a specified thickness.

Referring now to FIG. 12, the mold 10 of FIG. 1 is shown wherein a first rectangular protrusion 18a has a width 48 no larger than 4 mils, a height 50 of at least 2 mils and, therefore, an aspect ratio of at least 0.5. First rectangular protrusion 18a also has a separation 52 of no more than 4 mils from a second rectangular protrusion 18b. In addition, cylindrical protrusion 16 has a diameter 54 of no more than 4 mils.

With reference now to FIG. 13, ceramic slurry 26 is filled or leveled to a specified depth 56 in the mold 10. Depth 56 may be, for instance, less than 7 mils.

Figure 14:
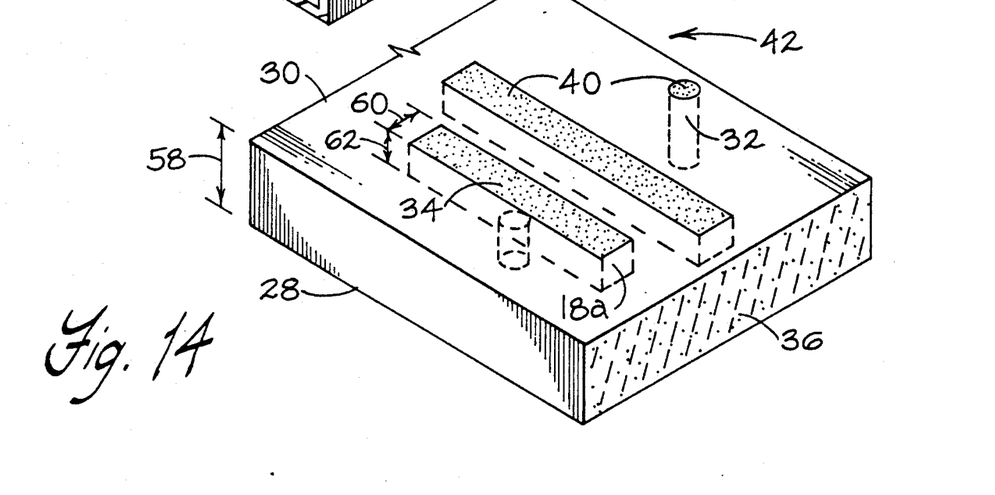
FIG. 14 is an isometric view of a ceramic green sheet with trenches and vias filled with electrically conductive paste after curing the ceramic slurry, removing the ceramic green sheet from the mold of FIG. 13 and inverting the green sheet.

Referring now to FIG. 14, the ceramic slurry of FIG. 13 is cured to a ceramic green sheet 36 and is removed from the mold 10 (not shown). The ceramic green sheet 36 is shown inverted so that essentially flat surface 30 that was on the floor 12 of the mold 10 is now the exposed top surface. Likewise, the surface 28 that was the top surface is now the bottom surface. Vias 32 and trenches 34 are filled with a metal paste 40 to produce a planar substrate-metal structure 42. The green sheet 36 is a specified thickness 58 corresponding to the fill depth 56 in FIG. 13. That is, green sheet thickness 58 is less than 7 mils. Likewise, the metal paste 40 is a specified width 60 and height 62 corresponding to the width 48 and height 50 of protrusion 18a in FIG. 12. The ratio of the metal height 62 to metal width 60 defines the aspect ratio for the metal in trench 18a.

Figure 15:
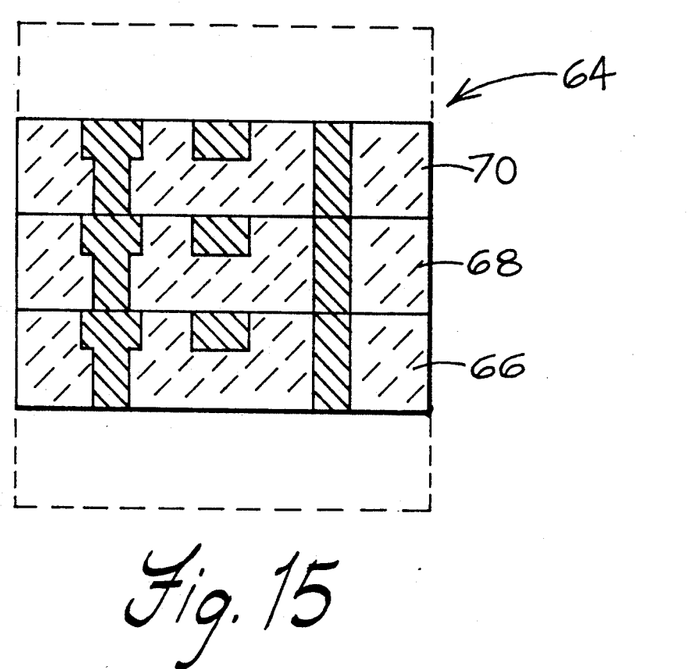
FIG. 15 is a cross-sectional view of a multilayer ceramic structure.

Referring now to FIG. 15, before firing, a compact multilayer ceramic structure 64 can be composed by stacking ceramic layers 66, 68 and 70, each of which may be formed in accordance with the embodiments previously described herein. Of course, more than three layers can be used (as shown by the broken lines), such as 12 layers stacked into a structure no more than 60 mils thick before firing. Thus, the present invention provides via and/or trench formation as an integral part of casting ceramic green sheets in the fabrication of multilayer ceramic packaging, particularly packages which require vertical conductors and/or vias such as substrates, multi-chip modules and pin grid arrays.

Of course, numerous changes and variations in the aforementioned embodiments will be apparent to those skilled in the art. For instance, the patterned mold protrusions can take whatever shapes, heights etc. that can be sculptered into the mold. Also, the use of extruded or injected plastic molds allows for a wide variety of protrusion patterns as well as low adherence (easy separation) with the flexible ceramic green sheets and/or the fired, hardened ceramics.

The present invention, therefore, is well adapted to carry out the objects and attain the ends and advantages mentioned, as well as others inherent therein. While presently preferred embodiments of the present invention have been described for the purpose of disclosure, numerous other changes in the details of construction, arrangement of parts, compositions and materials selection, processing steps can be carried out without departing from the spirit of the present invention which is intended to be limited only by the scope of the appended claims.

What is claimed is:

1. A method of forming a recessed pattern in an insulating substrate for use in a multilayer ceramic module, comprising the steps of:
   providing a sculptured plastic tape mold with a protrusion;
   casting a castable insulator into the mold;
   solidifying the insulator; and
   removing the solidified insulator from the mold so as to form an insulating substrate with a recessed pattern shaped by the protrusion.

2. The method of claim 1 wherein the castable insulator is a polymer.

3. The method of claim 2 wherein the polymer is an epoxy.

4. The method of claim 2 wherein the polymer is a polyimide.

5. The method of claim 1 wherein the castable insulator is a slurry.

6. The method of claim 5 wherein the slurry is a ceramic slurry.

7. The method of claim 6 wherein the ceramic slurry is solidified into a ceramic green sheet.

8. The method of claim 7, further comprising: filling the recessed pattern with a conductor; and firing the ceramic green sheet to form a rigid ceramic substrate having a fully inlaid, firmly bonded conductor pattern which replicates the shape of the protrusion.

9. The method of claim 7, further comprising:
   firing the ceramic green sheet before removing the ceramic green sheet from the mold so as to form a rigid ceramic substrate with the recessed pattern,
   separating the rigid ceramic substrate from the mold, and then
   filling the recessed pattern with a conductor to form a fully inlaid, firmly bonded conductor pattern which replicates the shape of the protrusion.

10. The method of claim 8 wherein the conductor is selected from the group consisting of an electrical conductor and an optical conductor.

11. The method of claim 9 wherein the conductor is selected from the group consisting of an electrical conductor and an optical conductor.

12. The method of claim 6 wherein the protrusion is at least 4 mils high and no more than 4 mils wide.

13. The method of claim 12 wherein the recessed pattern is in the top major surface of the substrate, the surface is essentially flat, and the substrate is less than 7 mils thick.

14. The method of claim 13, further comprising: filling the recessed pattern with a conductor such that the filled conductor has an aspect ratio of at least 0.5.

15. A method of making a recessed pattern in an insulating substrate, which includes forming a recessed pattern in a ceramic green sheet for use in a multilayer ceramic module, comprising the steps of:
   providing a sculptured plastic tape mold which comprises a floor and a plurality of protrusions on and extending above the floor;
   casting a ceramic slurry into the mold such that the slurry contacts the floor and the protrusions; and
   drying the slurry so as to produce a ceramic green sheet with a recessed pattern that replicates the shapes of the protrusions.

16. The method of claim 15 wherein at least one protrusion forms a trench partially through the thickness of the ceramic green sheet.

17. The method of claim 15 wherein at least one protrusion forms a via completely through the thickness of the ceramic green sheet.

18. The method of claim 15 wherein at least one protrusion forms a trench partially through the thickness of the ceramic green sheet and wherein at least one other protrusion forms a via completely through the thickness of the ceramic green sheet.

19. The method of claim 15 wherein the ceramic green sheet is removed from the mold while the ceramic green sheet is flexible.

20. The method of claim 19, further comprising:
   filling the recessed pattern in the ceramic green sheet with an electrically conductive metal paste.

21. The method of claim 20, further comprising:
   leveling the electrically conductive metal paste flush with the surface of the ceramic green sheet, and then
   firing the ceramic green sheet.

22. The method of claim 20, further comprising:
   firing the ceramic green sheet to form a rigid ceramic substrate having a fully inlaid, firmly bonded metallurgical pattern which replicates the shapes of the protrusions.

23. The method of claim 20 wherein the metal paste filling the recessed pattern does not extend above the upper surface of the ceramic green sheet.

24. The method of claim 20 wherein the metal paste is selected from the group consisting of molybdenum, tungsten, gold and copper.

25. The method of claim 15, further comprising:
   firing the ceramic green sheet before removing the ceramic green sheet from the mold so as to incinerate the mold and form a rigid ceramic substrate.

26. The method of claim 25, further comprising:
   filling the recessed pattern in the rigid ceramic substrate with an electrical conductor to form a fully inlaid, firmly bonded metallurgical pattern which replicates the shapes of the protrusions.

27. The method of claim 15 wherein the slurry comprises a polymer bonding agent with suspended particles.

28. The method of claim 15 wherein a first protrusion is no larger than 4 mils wide.

29. The method of claim 28 wherein the recessed pattern is in the top major surface of the green sheet, the surface is essentially flat, the green sheet is less than 7 mils thick, and the first protrusion is at least 2 mils high and separated by no more than 4 mils from a second protrusion.

30. The method of claim 15, further comprising:
a plurality of sidewalls adjacent to and extending above the floor of the mold, wherein the slurry in the mold contacts the sidewalls.

31. The method of claim 15, further comprising:
stacking a plurality of layers of the ceramic green sheet into a multilayer ceramic structure.

32. A method of forming a recessed pattern of openings in a top major surface of a ceramic green sheet suitable for firing into a multilayer ceramic package with a fully inlaid, firmly bonded metallurgy filled into the recessed pattern, comprising, in sequence, the steps of:
providing a sculptured plastic tape mold which comprises a planar floor, a pair of planar sidewalls adjacent to and extending perpendicularly above opposite sides of the floor, a plurality of vertically disposed cylindrical protrusions on and extending above the floor, and a plurality of horizontally disposed rectangular protrusions on and extending above the floor with flat top surfaces positioned in parallel with the floor and located beneath the top surfaces of the cylindrical protrusions and the sidewalls;
casting a ceramic slurry into the mold such that the slurry is contained by the sidewalls and forms a uniform voidless layer with a top major surface against the floor, covers the floor and the rectangular protrusions, and surrounds and partially covers the cylindrical protrusions;
heating the slurry so as to dry the slurry into a flexible ceramic green sheet with a recessed pattern in the top major surface having a plurality of horizontal trenches partially through the thickness of the sheet which replicate the shapes of the rectangular protrusions and a plurality of vertical vias completely though the thickness of the sheet which replicate the shapes of the cylindrical protrusions; and
removing the mold from the recessed pattern without disturbing the shapes of the trenches and the vias.

33. The method of claim 32, further comprising:
removing the ceramic green sheet from the mold,
filling the recessed pattern in the ceramic green sheet with an electrically conductive metal paste, and
firing the ceramic green sheet to form a rigid ceramic substrate having a fully inlaid, firmly bonded metallurgical pattern of trenches and vias which replicate the shapes of the protrusions in the mold.

34. The method of claim 32, further comprising:
heating the ceramic green sheet before removing the ceramic green sheet from the mold,
continuing the heating until the heat causes the mold to separate from the recessed pattern and the ceramic green sheet is fired into a rigid ceramic substrate,
discontinuing the heating so as to cool the rigid ceramic substrate, and then
filling the recessed pattern in the rigid ceramic substrate with an electrical conductor to form a fully inlaid, firmly bonded metallurgical pattern of trenches and vias which replicate the shapes of the protrusions in the mold.

35. The method of claim 32 wherein a first cylindrical protrusion is no more than 4 mils in diameter.

36. The method of claim 35 wherein a first rectangular protrusion is not more than 4 mils wide.

37. The method of claim 36 wherein the first rectangular protrusion is at least 2 mils high.

38. The method of claim 37 wherein the first rectangular protrusion and a second rectangular protrusion are no more than 4 mils apart.

39. The method of claim 38 wherein the recessed pattern is in an essentially flat top major surface of the green sheet and the green sheet is less than 7 mils thick.

40. The method of claim 39, further comprising:
removing the ceramic green sheet from the mold,
filling the recessed pattern in the ceramic green sheet with an electrically conductive metal paste, and
firing the ceramic green sheet to form a rigid ceramic substrate having a fully inlaid, firmly bonded metallurgical pattern of trenches and vias which replicate the shapes of the protrusions in the mold.

41. The method of claim 32, further comprising:
stacking a plurality of layers of the ceramic green sheet into a multilayer ceramic structure.

42. The method of claim 41 wherein the structure contains at least 12 ceramic layers and is no more than 60 mils thick before firing.

43. The method of claim 1 wherein the casting is performed by doctor blading.

44. The method of claim 15 wherein the casting includes pouring the slurry onto the floor and the protrusions which are exposed by the mold.

45. The method of claim 15 wherein after casting the slurry, and before drying the slurry, the side of the slurry opposite the floor is exposed by the mold.

46. The method of claim 15 wherein during drying the slurry, the side of the slurry opposite the floor is exposed by the mold.

47. The method of claim 30 wherein the mold consists of the floor, the protrusions and the sidewalls.

48. A method of forming a recessed pattern in an insulating substrate for use in a multilayer ceramic module, comprising the steps of:
providing a mold with a protrusion;
casting a ceramic slurry into the mold;
solidifying the slurry into a ceramic green sheet;
firing the ceramic green sheet before removing the ceramic green sheet from the mold, thereby transforming the ceramic green sheet into a rigid ceramic substrate; and
removing the rigid ceramic substrate from the mold, said substrate containing a recessed pattern shaped by the protrusion and adapted to be filled with a conductor.

49. A method of forming a conductive pattern in a rigid ceramic substrate for use in a multilayer ceramic module, comprising the steps of:
providing a mold which comprises a floor and a plurality of protrusions on and extending above the floor;
casting a ceramic slurry into the mold such that the slurry contacts the floor and the protrusions;

drying the slurry so as to produce a ceramic green sheet with a recessed pattern that replicates the shapes of the protrusions;

firing the ceramic green sheet before removing the ceramic green sheet from the mold so as to form a rigid ceramic substrate with the recessed pattern;

removing the rigid ceramic substrate from the mold; and then filling the recessed pattern of the rigid ceramic substrate with a conductor.

50. The method of claim 49 wherein the mold is a sculptured plastic tape and the ceramic slurry is deposited into the mold by casting.

51. The method of claim 50 wherein the sculptured plastic tape mold has a melting or vaporization temperature which is exceeded during the firing.

52. The method of claim 51 wherein the rigid ceramic carrier is removed from the mold by incinerating the mold during the firing.

53. The method of claim 49 wherein the conductor has a melting point which is exceeded during the firing.

54. The method of claim 49 wherein the recessed pattern is filled with the conductor by electroless deposition.

55. A method of making a conductive pattern in the top major surface of a rigid ceramic substrate, comprising the following steps in the sequence set forth:

providing a mold which comprises a planar floor, a pair of planar sidewalls adjacent to and extending perpendicularly above opposite sides of the floor, a plurality of vertically disposed cylindrical protrusions on and extending above the floor, and a plurality of horizontally disposed rectangular protrusions on and extending above the floor with flat top surfaces positioned in parallel with the floor and located beneath the top surfaces of the cylindrical protrusions and the sidewalls;

pouring a ceramic slurry into the mold such that the slurry is contained by the sidewalls and forms a uniform voidless layer with a top major surface against the floor, covers the floor and the rectangular protrusions, and surrounds and partially covers the cylindrical protrusions;

heating the slurry so as to dry the slurry into a flexible ceramic green sheet with a recessed pattern in the top major surface having a plurality of horizontal trenches partially through the thickness of the sheet which replicate the shapes of the rectangular protrusions and a plurality of vertical vias completely though the thickness of the sheet which replicate the shapes of the cylindrical protrusions;

firing the ceramic green sheet before removing the ceramic green sheet from the mold so as to form a rigid ceramic substrate and removing the rigid ceramic substrate from the mold without disturbing the shapes of the trenches and the vias; and filling the trenches and vias with an electrical conductor to form a fully inlaid, firmly bonded metallurgical pattern of trenches and vias in the rigid ceramic substrate which replicate the shapes of the protrusions in the mold.

* * * * *